United States Patent
Mayer et al.

(10) Patent No.: US 10,324,506 B2
(45) Date of Patent: Jun. 18, 2019

(54) THERMAL MANAGEMENT APPARATUS

(71) Applicant: Hewlett Packard Enterprise Development LP, Houston, TX (US)

(72) Inventors: Dave Mayer, Fort Collins, CO (US); Steven E. Hanzlik, Fort Collins, CO (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/579,921

(22) PCT Filed: Jun. 5, 2015

(86) PCT No.: PCT/US2015/034586
§ 371 (c)(1),
(2) Date: Dec. 5, 2017

(87) PCT Pub. No.: WO2016/195721
PCT Pub. Date: Dec. 8, 2016

(65) Prior Publication Data
US 2018/0224910 A1     Aug. 9, 2018

(51) Int. Cl.
*G06F 1/20* (2006.01)
*H05K 7/20* (2006.01)
(Continued)

(52) U.S. Cl.
CPC ......... *G06F 1/206* (2013.01); *F28D 15/0233* (2013.01); *G06F 1/20* (2013.01);
(Continued)

(58) Field of Classification Search
CPC ............... H05K 7/20509; H05K 7/208; H05K 7/20809; H05K 7/20881; H05K 7/2099;
(Continued)

(56) References Cited

U.S. PATENT DOCUMENTS 6,198,628 B1   3/2001   Smith
6,305,180 B1   10/2001   Miller
(Continued)

FOREIGN PATENT DOCUMENTS

| JP | 2010010609 | 1/2010 |
| JP | 2011-119754 A | 6/2011 |
| JP | 4987805 | 7/2012 |

OTHER PUBLICATIONS

CCokeman; "Sapphire HD 7790 Dual-X OC Closer Look," 6 pagesMar. 21, 2013.
(Continued)

*Primary Examiner* — Dion Ferguson
*Assistant Examiner* — Amir A Jalali
(74) *Attorney, Agent, or Firm* — Hewlett Packard Enterprise Patent Department

(57) ABSTRACT

In the examples provided herein, an apparatus has modules to be cooled during operation, where each module is coupled to a heatsink, and the heatsinks are coupled to a first surface of a thermally conductive plate. The modules are positioned along a direction from a first side of the plate toward an opposite side of the plate. The apparatus also has heat pipes coupled to a second surface of the plate to transport heat away from the modules during operation, where the heat pipes are positioned nonuniformly along the direction.

14 Claims, 8 Drawing Sheets

(51) Int. Cl.
*F28D 15/02* (2006.01)
*H01L 23/427* (2006.01)

(52) U.S. Cl.
CPC ........ *H05K 7/20809* (2013.01); *H01L 23/427* (2013.01); *H05K 7/20145* (2013.01)

(58) Field of Classification Search
CPC ... G06F 1/206; H01L 23/427; H01L 23/4275; F28D 15/00; F28D 15/0233
USPC ....... 361/679, 699, 700, 702, 704, 711, 713, 361/679.47–679.48, 679.52–679.54; 165/80.3, 80.4, 80.5, 104.26, 104.33, 165/104.34, 104.21, 185; 257/715, 257/E23.088; 174/15.2, 548
See application file for complete search history.

(56) References Cited

U.S. PATENT DOCUMENTS

| | | | |
|---|---|---|---|
| 7,088,583 B2 | 8/2006 | Brandon | |
| 7,113,401 B2 | 9/2006 | Becker | |
| 7,436,059 B1* | 10/2008 | Ouyang | H01L 23/34 257/712 |
| 7,447,017 B2 | 11/2008 | Koo | |
| 7,788,940 B2 | 9/2010 | Madara | |
| 8,320,121 B2 | 11/2012 | Bisson | |
| 2003/0205363 A1* | 11/2003 | Chu | F28D 15/0266 165/80.3 |
| 2005/0257532 A1* | 11/2005 | Ikeda | F25B 21/02 62/3.7 |
| 2009/0135563 A1 | 5/2009 | Sakata | |
| 2009/0159905 A1* | 6/2009 | Chen | F21K 9/00 257/88 |
| 2011/0279969 A1* | 11/2011 | Memon | G06F 1/20 361/679.47 |
| 2012/0085520 A1* | 4/2012 | Pfaffinger | H01L 23/427 165/104.26 |
| 2012/0160456 A1 | 6/2012 | Aoki | |
| 2014/0069611 A1* | 3/2014 | Liu | H01L 23/36 165/80.3 |
| 2015/0138731 A1* | 5/2015 | Mann | H05K 7/20336 361/700 |
| 2015/0237767 A1* | 8/2015 | Shedd | H05K 7/20254 165/104.31 |
| 2017/0023228 A1* | 1/2017 | Dyson | F21S 8/06 |

OTHER PUBLICATIONS

CCokeman; "ASUS Rampage v Extreme Closer Look," 10 pages; Jan. 27, 2015.
PCT/ISA/KR, International Search Report and Written Opinion, dated Feb. 29, 2016, PCT/US2015/034586, 11 pages.

\* cited by examiner

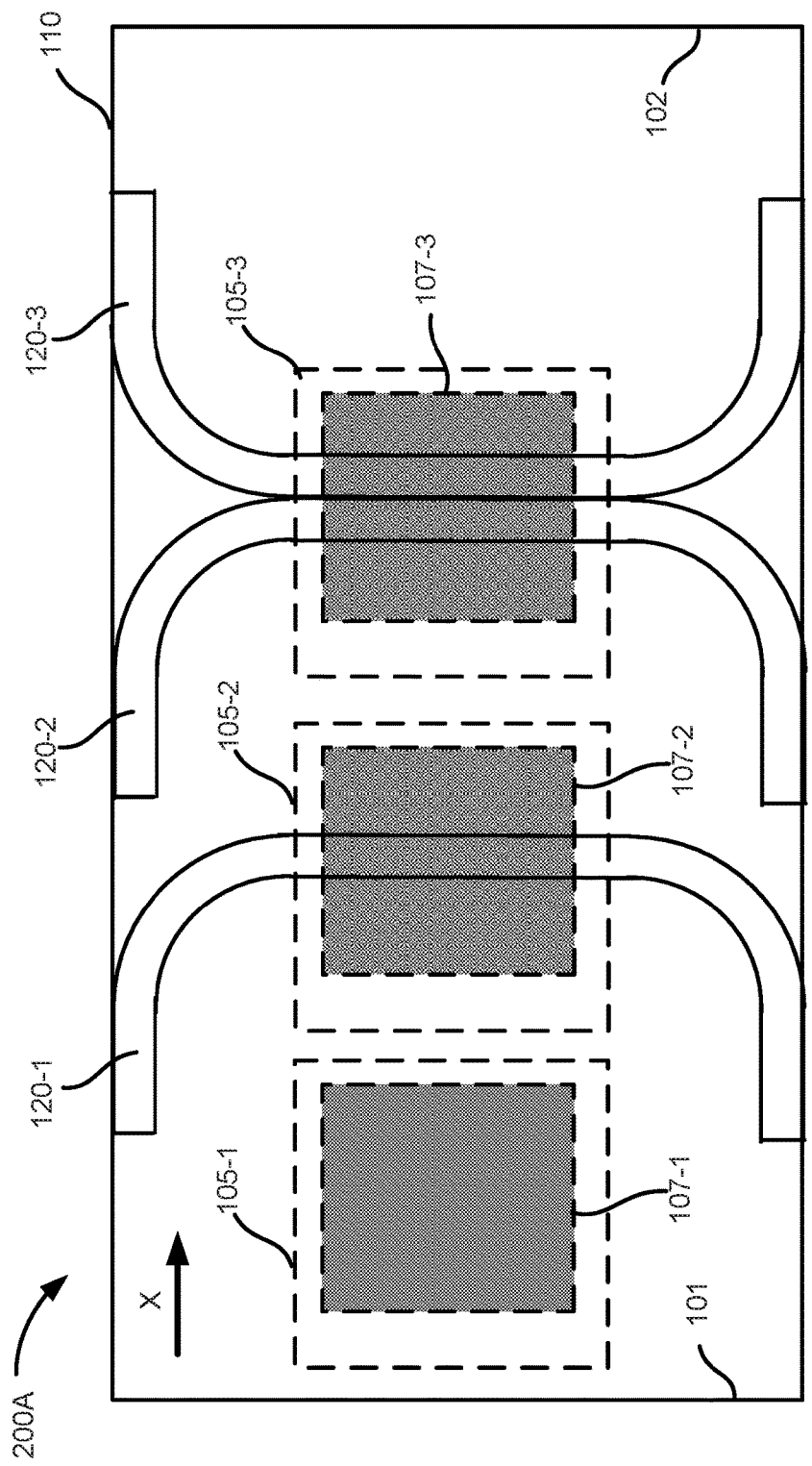

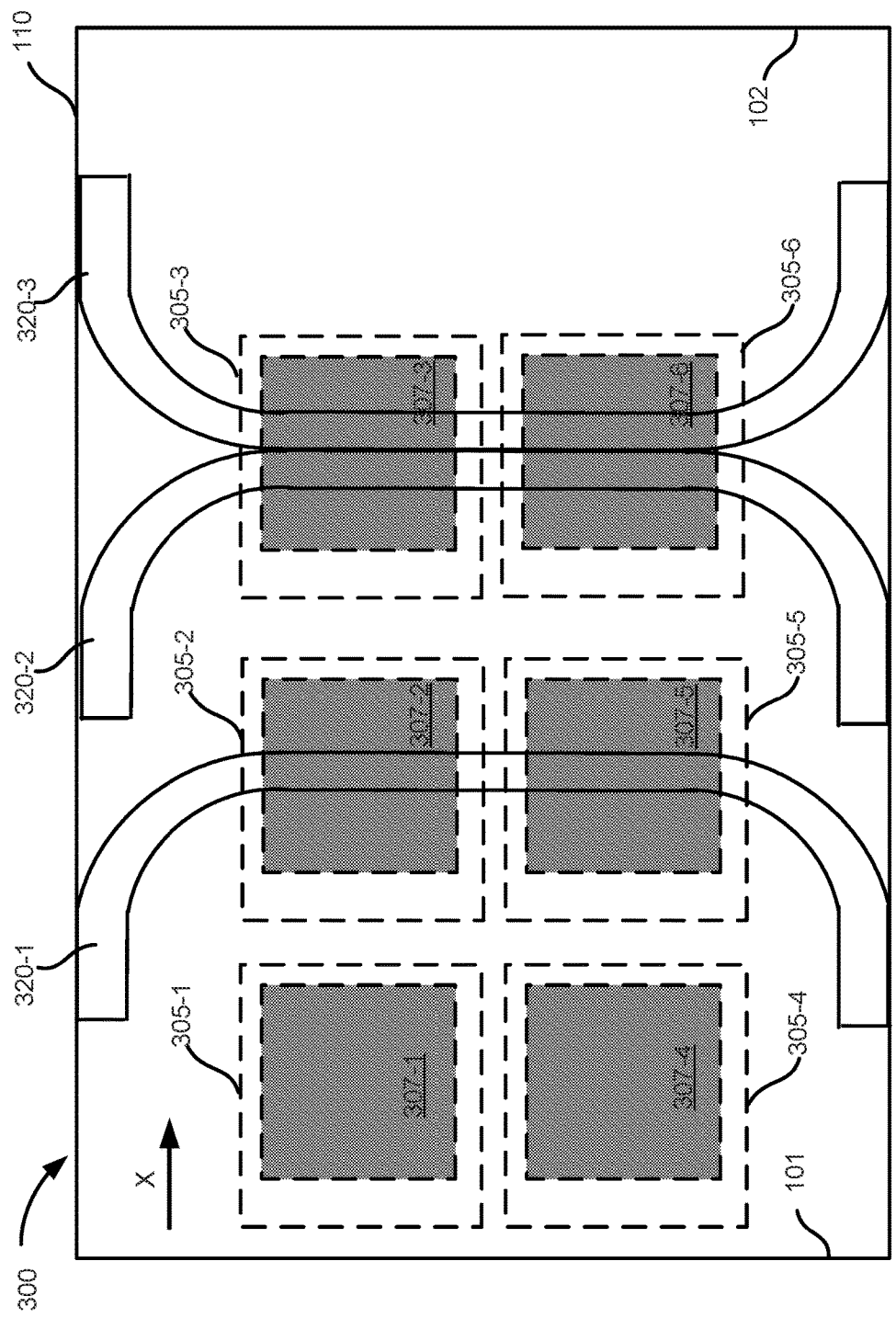

THERMAL MANAGEMENT APPARATUS

BACKGROUND

A processor-based device that generates heat, such as a computer system, may use different cooling systems, for example, fans and heatsinks, to attempt to maintain the components in the device at acceptable operating temperatures. If the temperature within the device rises above acceptable limits, the processors may malfunction, thus shortening the lifespan of the device.

BRIEF DESCRIPTION OF THE DRAWINGS

The accompanying drawings illustrate various examples of the principles described below. The examples and drawings are illustrative rather than limiting.

FIG. 2A depicts an example thermal management apparatus with heat-generating modules.

FIG. 3 depicts yet another example thermal management apparatus with heat-generating modules.

DETAILED DESCRIPTION

Heat-generating modules in an apparatus, such as processors in a computer enclosure, may have different cooling requirements, even if they are identical, because of the positioning of the modules relative to available cooling air. Nonuniformly positioned heat pipes in an asymmetrical auxiliary design may be used to provide more cooling to the modules that are positioned farther away from the source of the cooling air.

Ambient air may be drawn through the apparatus that has heat-generating components in an attempt to cool the components. However, as thermal energy dissipated by the components is transferred to the air, the temperature of the air rises, and the rise in air temperature makes it more difficult to cool the downstream components than the upstream components closest to the entering ambient air.

One advantage of using the asymmetrical auxiliary design is that a common heatsink may be used for each heat-generating module such that the rear components farthest downstream from the entering ambient air is under-provisioned, with auxiliary thermal add-ons compensating for the downstream components. As a result, all heatsinks may be common so that the design is less expensive. Further, the common heatsinks are not overprovisioned so that the heatsinks are smaller and less expensive.

Figure 1:
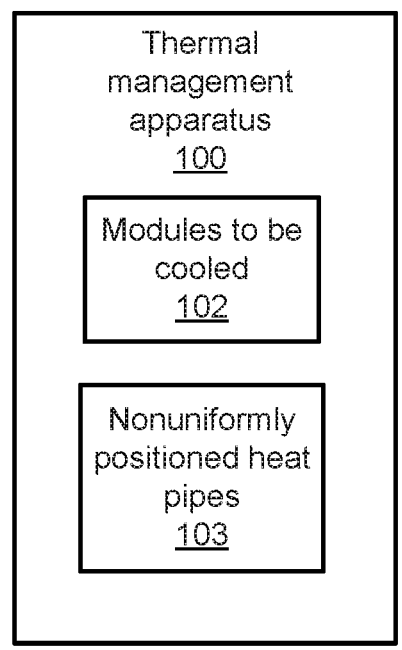
FIG. 1 depicts a block diagram of an example thermal management apparatus.

FIG. 1 depicts a block diagram of an example thermal management apparatus 100. The thermal management apparatus 100 may include heat-generating modules 102 to be cooled during operation of the modules and nonuniformly positioned heat pipes 103. Examples of heat-generating modules 102 may include electronic modules, such as a central processing unit (CPU) and a graphics processing unit (GPU). In some implementations, the heat-generating modules 102 may be the same. However, the heat-generating modules 102 are not restricted to being the same. The heat-generating modules 102 may be coupled directly to a thermally conductive plate (not shown in FIG. 1). Alternatively, the heat-generating modules 102 may be coupled indirectly to a thermally conductive plate, for example, the heat-generating module 102 may each be coupled to a heatsink, and each heatsink may be coupled to the thermally conductive plate.

The thermal management apparatus 100 may also include nonuniformly positioned heat pipes 103 that transport heat away from the heat-generating modules 102 during operation. Each individual heat-generating module 102 may operate under different environmental conditions, for example, because the heat-generating module closest to a source of cooling air circulated within the thermal management apparatus 100 may experience a lower environmental temperature, while the heat-generating module farthest from the source of cooling air may experience a higher environmental temperature. Thus, more heat pipes 103 may be used to remove heat from near the farthest heat-generating module than from the closest heat-generating module to the source of cooling air, which results in nonuniformly positioned heat pipes. Example layouts of heat pipes 103 are described below.

FIG. 2A depicts an example thermal management apparatus 200A with heat-generating modules 105-1, 105-2, 105-3 to be cooled during operation of the modules. While three heat-generating modules 105-1, 105-2, 105-3 are shown in the example of FIG. 1, the concepts described herein apply to any number of heat-generating modules 105 greater than one.

Coupled to each of the heat-generating modules 105-1, 105-2, 105-3 is a corresponding heatsink 107-1, 107-2, 107-3. The heat-generating modules 105-1, 105-2, 105-3 are coupled via the heatsinks 107-1, 107-2, 107-3 to a first surface of a base plate 110. The heatsinks 107-1, 107-2, 107-3 may or may not be the same.

The base plate 110 may be thermally conductive and made from any type of material, such as metal or an alloy. The base plate 110 has a second surface opposite the first surface, and the view of the apparatus 100 shown in FIG. 2A is from the second surface. Thus, the heat-generating modules 105-1, 105-2, 105-3 and heatsinks 107-1, 107-2, 107-3 coupled to the first surface of the base plate 110 are shown with a dotted outline.

Figure 2B:
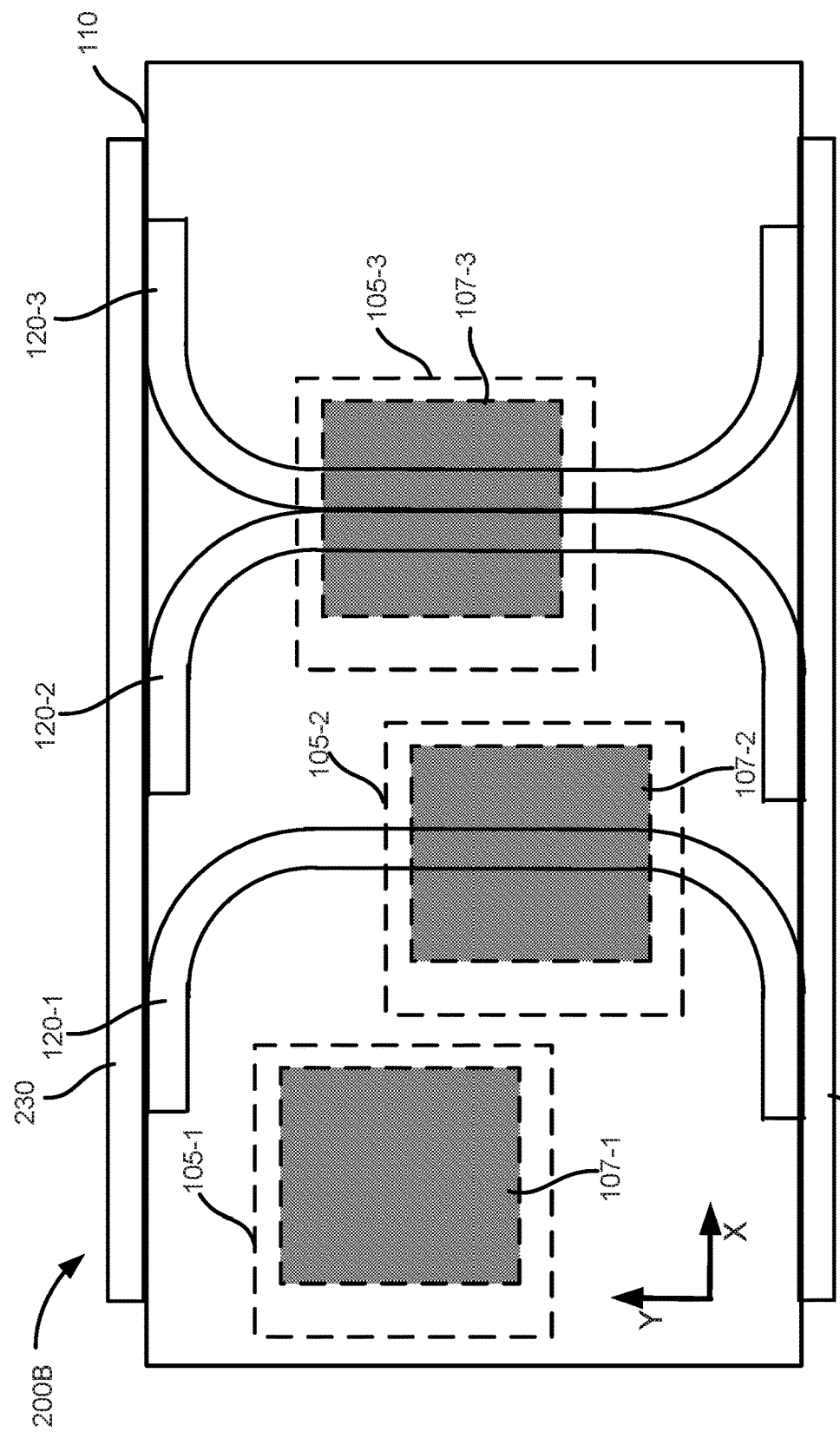
FIG. 2B depicts another example thermal management apparatus with heat-generating modules.

The heat-generating modules 105-1, 105-2, 105-3 may be positioned along a direction, for example, the x-direction indicated in the example of FIG. 2A that is directed from a first side 101 of the base plate 110 toward an opposite side 102 of the base plate 110. However, the heat-generating modules 105-1, 105-2, 105-3 positioned along the x-direction need not be aligned in the perpendicular y-direction. As shown in the example of FIG. 2B, the heat-generating modules 105-1, 105-2, 105-3 of apparatus 200B may be displaced sideways relative to each other.

Returning to FIG. 2A, the heat-generating modules 105-1, 105-2, 105-3 may be positioned such that the first heat-generating module 105-1 is closest to the first side 101 of the base plate 110 where cooler air from outside the apparatus 100 may be directed by a fan (not shown) into the apparatus 100 across the first side 101 toward the opposite side 102 of the base plate 110. Further, the second heat-generating module 105-2 may be positioned farther away from the first side 101 where the cooler air enters, and the third heat-generating module 105-3 may be positioned farthest away from the first side 101, such that the second heat-generating module 105-2 is positioned between the first heat-generating module 105-1 and the third heat-generating module 105-3 in the x-direction.

Coupled to the second surface of the base plate 110 are heat pipes 120-1, 120-2, 120-3 to transport heat away from the heat-generating modules 1051, 105-2, 1053 during operation. The heat pipes may be positioned nonuniformly along the x-direction, for example, along the travel direction of the cooling air, to transport more heat away from the heat-generating modules farther away from the first side 101 where the cooling air enters. For example, a first set of heat pipes may be positioned on the second surface of the base plate 110 directly opposite the first heat-generating module 105-1, a second set of heat pipes may be positioned on the second surface of the base plate 110 directly opposite the second heat-generating module 105-2, and a third set of heat pipes may be positioned on the second surface of the base plate 110 directly opposite the third heat-generating module 105-3, where the number of heat pipes in the first set, the second set, and the third set may be different.

Because the second heat-generating module 105-2 is positioned farther from the entering cooling air, it may experience higher temperatures than the first heat-generating module 105-1 closest to the entering cooling air. Further, because the third heat-generating module 105-3 is positioned farther from the entering cooling air than the second heat-generating module 105-2, it may experience even higher temperatures than the second heat-generating module 105-2. Thus, the number of heat pipes in the second set may be greater than the number of heat pipes in the first set so that the second set of heat pipes effectively removes more heat than the first set of heat pipes. Similarly, the number of heat pipes in the third set of heat pipes may be greater than the number of heat pipes in the second set so that the third set of heat pipes effectively removes more heat than the second set of heat pipes.

In the example of FIG. 2A, the first set of heat pipes is a null set, where no heat pipes are used to remove heat from the first heat-generating module 105-1 because it is closest to the cooling air. The second set of heat pipes includes one heat pipe 120-1, and the third set of heat pipes includes two heat pipes 120-2, 120-3. However, the number of heat pipes shown in the figures are examples, and any number of heat pipes may be used in the various sets of heat pipes, such that the sets of heat pipes that remove more heat from hotter heat-generating modules have relatively more heat pipes. In some implementations, the heat pipes 120-1, 120-2, 120-3 may be hollow and include a wick and a working fluid sealed inside. In some implementations, the heat pipes 120-1, 120-2, 120-3 may be the same, for example, with the same dimensions, pipe material, wick structure, and working fluid. However, the heat pipes 120 may be different to transport heat away from the heat-generating module 105 at different rates.

Additionally, in some implementations, the thermally conductive plate 110 may be configured to transport heat asymmetrically to balance the different thermal requirements of the heat-generating modules 105. For example, the plate 110 may use materials with higher thermal conductivity near the hotter heat-generating modules 105. In some implementations, the higher thermal conductivity materials may be strategically placed to provide heat paths to remove more heat more quickly.

FIG. 2B depicts another example thermal management apparatus 200B with heat-generating modules 105. As discussed above, the heat-generating modules 105 need not be aligned in the y-direction. Additionally, the thermal management apparatus 200B may include one or more fins 230, 232 thermally coupled to the heat pipes 120 and/or the base plate 110 to increase the rate of heat transfer out of the apparatus 200B. In some implementations, the fins may be positioned along the x-direction to conduct heat away from the heat pipes 120, although the fins may be positioned along any suitable direction. While two fins 230, 232 are shown in the example of FIG. 2B, one fin or more than two fins may be used.

FIG. 3 depicts yet another example thermal management apparatus 300 with additional units of heat-generating modules 305 to be cooled during operation, where the additional units of heat-generating modules 305 form an array, not just a line of heat-generating modules 105, as shown in the examples of FIGS. 2A and 2B. Each additional unit of heat-generating module 305 may be coupled to an additional heatsink 307, and the additional heatsinks 307 may be coupled to the first surface of the base plate 110.

As shown in FIG. 3, additional units 305-1, 305-4 are positioned closest to cooling air that may be directed from outside the apparatus 300 across the first side 101 toward the opposite side 102 of the base plate 110. Thus, additional units 305-1, 305-4 may require the least amount of additional cooling. Additional units 305-2, 305-5 are positioned farther away from the first side 101, thus require more cooling. Thus, in the example of FIG. 3, a single heat pipe 320-1 is positioned directly opposite additional units 305-2, 305-5, while no heat pipes are positioned directly opposite additional units 305-1, 305-4. Further, additional units 305-3, 305-6 are positioned farthest away from the first side 101, and thus, require the most cooling. In the example of FIG. 3, two heat pipes 320-2, 320-3 are positioned directly opposite additional units 305-3, 305-6 to provide cooling.

Figure 4:
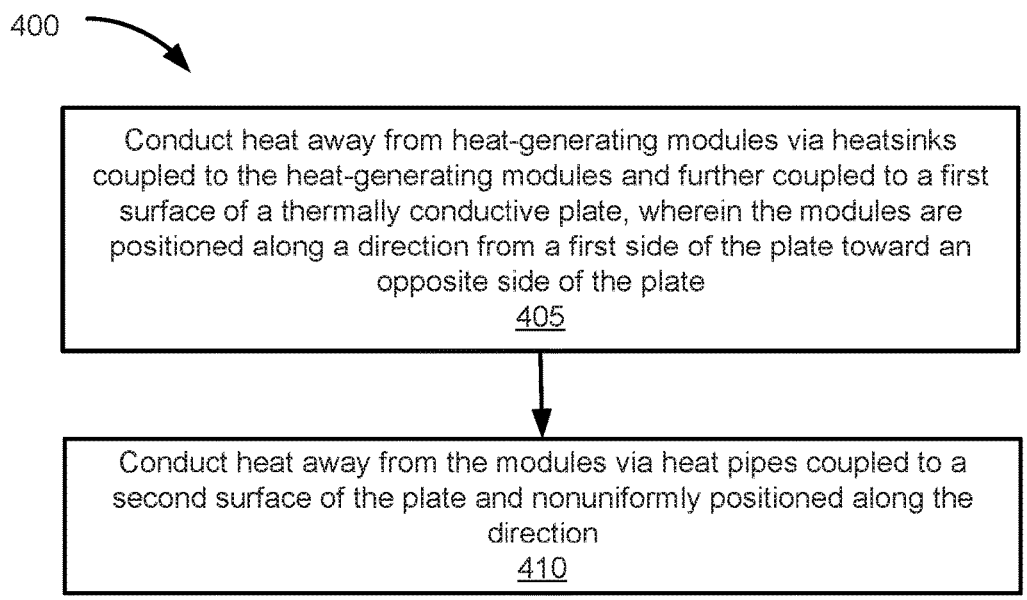
FIG. 4 depicts a flow diagram illustrating an example process of cooling an apparatus having heat-generating modules.

FIG. 4 depicts a flow diagram illustrating an example process 400 of cooling an apparatus having heat-generating modules.

At block 405, heat may be conducted away from heat-generating modules via heatsinks coupled to the heat-generating modules, where the heatsinks are further coupled to a first surface of a thermally conductive plate. The modules may be positioned along a first direction from a first side of the plate toward an opposite side of the plate. In some implementations, the modules may be misaligned in a perpendicular direction to the first direction. In some implementations, the modules may be positioned in an array.

At block 410, heat may be conducted away from the modules via heat pipes coupled to a second surface of the plate, opposite the first surface, where the heat pipes are positioned nonuniformly along the first direction. With nonuniformly positioned heat pipes, more heat pipes may be positioned on the plate directly opposite modules that are farther away from where cooling air may be directed toward the apparatus, while fewer heat pipes, or even no heat pipes may be positioned on the plate directly opposite modules that are closer to a source of cooling air.

Figure 5:
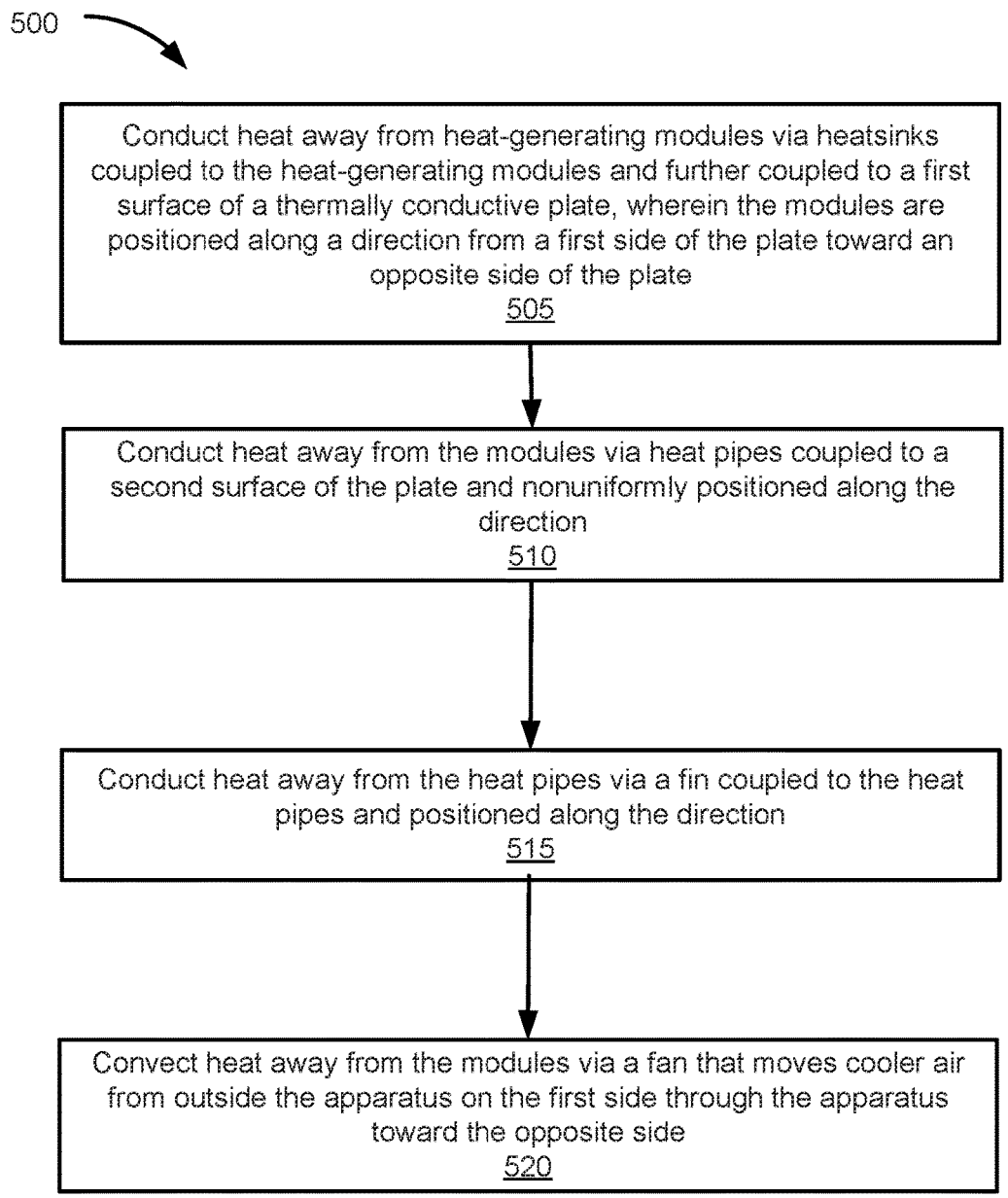
FIG. 5 depicts a flow diagram illustrating another example process of cooling an apparatus having heat-generating modules.

FIG. 5 depicts a flow diagram illustrating another example process 500 of cooling an apparatus having heat-generating modules. The process begins at block 505 which may be similar to block 405 described with respect to the process 400 of FIG. 4. Block 510 may also be similar to block 410 of FIG. 4.

At block 515, heat may be conducted away from the heat pipes via a fin coupled to the heat pipes. Alternatively or additionally, the fin may be coupled to the plate. More than one fin may be used to conduct away heat. The heat pipes may be positioned along the first direction or any other direction.

At block 520, heat may be convected away from the modules via a fan that moves cooler air from outside the apparatus on the first side through the apparatus toward the opposite side. Alternatively or additionally, another fan may move cooler air from outside the apparatus from a different side.

Figure 6:
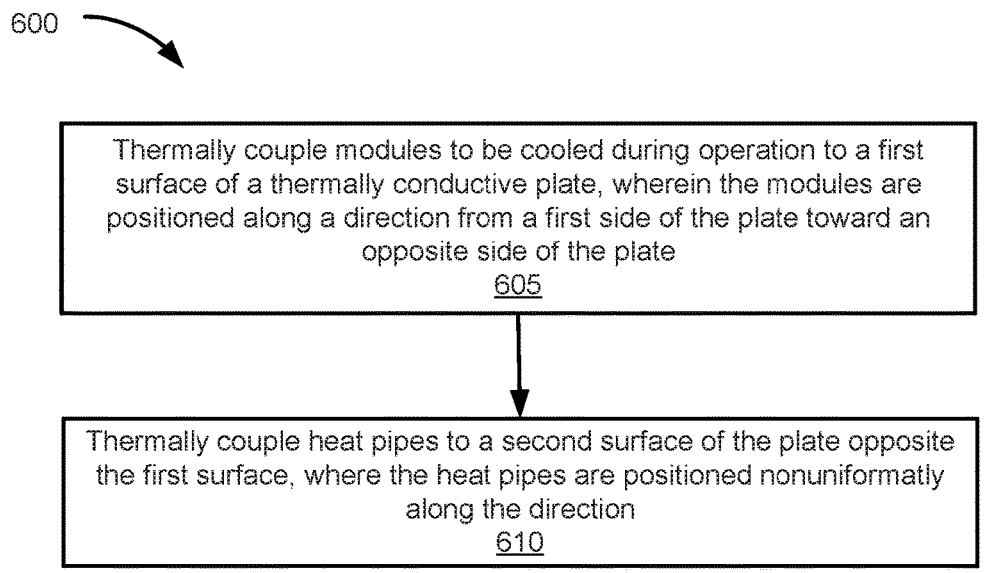
FIG. 6 depicts a flow diagram illustrating an example process of manufacturing a thermal management apparatus.

FIG. 6 depicts a flow diagram illustrating an example process 600 of manufacturing a thermal management apparatus.

At block 605, modules to be cooled during operation may be thermally coupled to a first surface of a thermally conductive plate, wherein the modules may be positioned along a direction from a first side of the plate toward an opposite side of the plate.

At block 610, heat pipes may be thermally coupled to a second surface of the plate opposite the first surface, where the heat pipes may be positioned nonuniformly along the direction.

Figure 7:
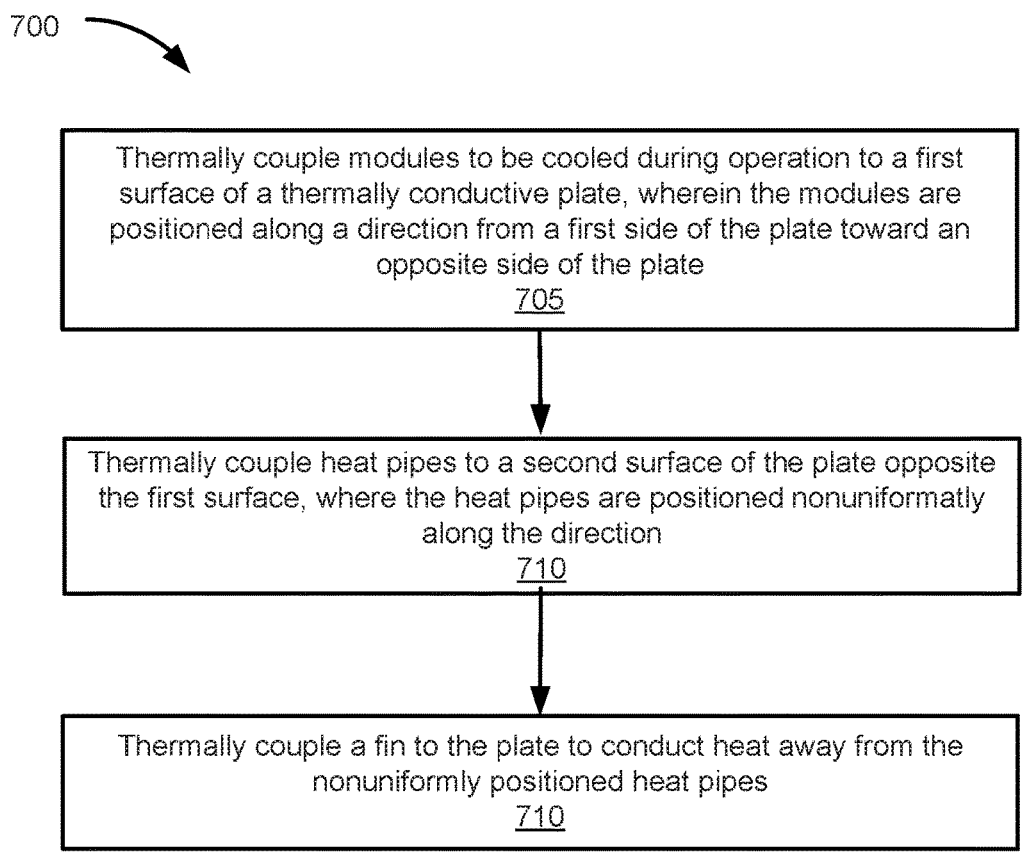
FIG. 7 depicts a flow diagram illustrating another example process of manufacturing a thermal management apparatus.

FIG. 7 depicts a flow diagram illustrating another example process 700 of manufacturing a thermal management apparatus. The process begins at block 705 which may be similar to block 605 described with respect to the process 600 of FIG. 6. Block 710 may also be similar to block 610 of FIG. 6.

At block 715, a fin may be thermally coupled to the plate to conduct heat away from the nonuniformly positioned heat pipes. Each module may be thermally coupled to a heatsink, and each heatsink may be coupled to the plate.

Not all of the steps, or features presented above are used in each implementation of the presented techniques.

As used in the specification and claims herein, the singular forms "a," "an," and "the" include plural referents unless the context clearly dictates otherwise.

What is claimed is:

1. A thermal management apparatus comprising:
a first, second, and third module to be cooled during operation, wherein each module is coupled to a heatsink, and the heatsinks are coupled to a first surface of a thermally conductive plate, and wherein the modules are positioned along a direction from a first side of the plate toward an opposite side of the plate, and wherein the first module is positioned closest to the first side of the plate, the third module is positioned farthest from the first side of the plate, and the second module is positioned between the first and third module; and
heat pipes coupled to a second surface of the plate to transport heat away from the modules during operation, wherein the heat pipes are positioned nonuniformly along the direction and include a first set of heat pipes positioned directly opposite the first module, a second set of heat pipes positioned directly opposite the second module, and a third set of heat pipes positioned directly opposite the third module,
wherein the third set of heat pipes removes more heat than the second set of heat pipes, and
wherein the second set of heat pipes removes more heat than the first set of heat pipes.

2. The apparatus of claim 1, wherein a fan moves cooler air from outside the apparatus across the first side of the plate, and wherein each heat pipe is hollow and includes a wick and a working fluid sealed inside.

3. The apparatus of claim 1, wherein the thermally conductive plate transports heat asymmetrically to balance different thermal requirements of the modules.

4. The apparatus of claim 1, wherein each of the modules is the same, and each of the heatsinks is the same, and further wherein each of the nonuniformly positioned heat pipes is the same.

5. The apparatus of claim 1, further comprising a fin coupled to the heat pipes and positioned along the direction to conduct heat away from the heat pipes.

6. The apparatus of claim 1, wherein the first set of heat pipes is a null set, the second set of heat pipes includes one heat pipe, and the third set of heat pipes includes two heat pipes.

7. The apparatus of claim 1, further comprising additional units to be cooled during operation, wherein each additional unit is coupled to an additional heatsink, and the additional heatsinks are coupled to the first surface of the plate, and the additional units and modules form an array, and wherein the heat pipes further transport heat away from the additional units during operation.

8. A method of cooling an apparatus, the method comprising:
conducting heat away from heat-generating modules via heatsinks coupled to the heat-generating modules and further coupled to a first surface of a thermally conductive plate, wherein the modules are positioned along a direction from a first side of the plate toward an opposite side of the plate, wherein the modules include a first module positioned closest to the first side of the plate, a third module positioned farthest from the first side of the plate, and a second module positioned between the first module and the third module; and
conducting heat away from the modules via heat pipes coupled to a second surface of the plate and nonuniformly positioned along the direction, wherein the heat pipes include a first set of heat pipes positioned directly opposite the first module, a second set of heat pipes positioned directly opposite the second module, and a third set of heat pipes positioned directly opposite the third module,
wherein the third set of heat pipes removes more heat than the second set of heat pipes, and
wherein the second set of heat pipes removes more heat than the first set of heat pipes.

9. The method of claim 8, further comprising:
conducting heat away from the heat pipes via a fin coupled to the heat pipes and positioned along the direction.

10. The method of claim 8, further comprising:
convecting heat away from the modules via a fan that moves cooler air from outside the apparatus on the first side through the apparatus toward the opposite side.

11. The method of claim 8, wherein nonuniformly positioned heat pipes comprise a larger number of heat pipes positioned farther away from the first side.

12. A method of manufacturing a thermal management apparatus, the method comprising:
thermally coupling modules to be cooled during operation to a first surface of a thermally conductive plate, wherein the modules are positioned along a direction from a first side of the plate toward an opposite side of the plate, wherein each of the modules is the same, and the modules include a first module positioned closest to the first side of the plate, a third module positioned farthest from the first side of the plate, and a second module positioned between the first module and the third module; and thermally coupling heat pipes to a second surface of the plate opposite the first surface, wherein the heat pipes are positioned nonuniformly along the direction, wherein the heat pipes include a first set of heat pipes positioned directly opposite the first module, a second set of heat pipes positioned directly opposite the second module, and a third set of heat pipes positioned directly opposite the third module, wherein the third set of heat pipes includes more heat pipes than the second set of heat pipes, and wherein the second set of heat pipes includes more heat pipes than the first set of heat pipes.

13. The method of claim 12, further comprising thermally coupling a fin to the heat pipes to conduct heat away from the nonuniformly positioned heat pipes.

14. The method of claim 12, wherein each module is coupled to a heatsink, and each heatsink is coupled to the plate.

\* \* \* \* \*